United States Patent
Morozumi et al.

(10) Patent No.: US 7,816,249 B2
(45) Date of Patent: Oct. 19, 2010

(54) METHOD FOR PRODUCING A SEMICONDUCTOR DEVICE USING A SOLDER ALLOY

(75) Inventors: Akira Morozumi, Nagano (JP); Shin Soyano, Nagano (JP); Yoshikazu Takahashi, Nagano (JP)

(73) Assignee: Fuji Electric Systems Co., Ltd., Tokyo (JP)

( * ) Notice: Subject to any disclaimer, the term of this patent is extended or adjusted under 35 U.S.C. 154(b) by 177 days.

(21) Appl. No.: 12/213,923

(22) Filed: Jun. 26, 2008

(65) Prior Publication Data

US 2009/0093109 A1  Apr. 9, 2009

Related U.S. Application Data

(63) Continuation-in-part of application No. 11/345,516, filed on Feb. 2, 2006, now abandoned.

(30) Foreign Application Priority Data

May 20, 2005 (JP) ............................ 2005-148730

(51) Int. Cl.
 *H01L 21/44* (2006.01)
(52) U.S. Cl. ................ 438/612; 257/772; 257/E23.023
(58) Field of Classification Search ................ 438/612; 420/562; 257/772, E23.023
See application file for complete search history.

(56) References Cited

U.S. PATENT DOCUMENTS

| 6,033,488 | A | 3/2000 | An et al. |
| 6,179,935 | B1 | 1/2001 | Yamashita et al. |
| 6,353,258 | B1 | 3/2002 | Inoue et al. |
| 6,649,127 | B2 * | 11/2003 | Habu et al. .................. 420/561 |
| 6,774,298 | B2 | 8/2004 | Tauchi et al. |
| 7,626,264 | B2 * | 12/2009 | Yokoyama .................. 257/750 |
| 7,663,242 | B2 * | 2/2010 | Lewis et al. .................. 257/772 |
| 2004/0046241 | A1 * | 3/2004 | Combs et al. ............... 257/678 |

FOREIGN PATENT DOCUMENTS

| JP | H09-330941 A | 12/1997 |
| JP | H11-58066 A | 3/1999 |
| JP | 2003-094194 | 4/2003 |
| JP | 2004-001100 A | 1/2004 |

* cited by examiner

*Primary Examiner*—Nitin Parekh
(74) *Attorney, Agent, or Firm*—Manabu Kanesaka

(57) ABSTRACT

In producing a semiconductor device, a solder alloy is prepared to contain antimony in a range of from 3 to 5 wt %, a trace amount of germanium, and a balance of tin. An insulative substrate having conductor patterns on both surfaces thereof is prepared, and a heat sink plate is mounted on a back surface of the insulative substrate by a soldering process using the solder alloy at a temperature ranging from 310 C.° to 320 C.° in a hydrogen reducing furnace. A semiconductor chip is mounted on a front surface of the insulative substrate.

9 Claims, 1 Drawing Sheet

METHOD FOR PRODUCING A SEMICONDUCTOR DEVICE USING A SOLDER ALLOY

CROSS-REFERENCE TO RELATED APPLICATIONS

This is a continuation-in-part application of patent application Ser. No. 11/345,516 filed on Feb. 2, 2006, now abandoned which is based on, and claims priority from, Japanese Application No. 2005-148730, filed on May 20, 2005, the contents of which are incorporated herein by reference.

BACKGROUND OF THE INVENTION AND RELATED ART STATEMENT

The present invention relates to a method for producing a semiconductor device using a solder alloy free of lead, and, in particular, using a solder alloy of a tin (Sn)-antimony (Sb) system.

A solder alloy generally requires sufficient bonding performance and corrosion resistance. In power semiconductor devices for power converter application, a solder alloy is used to join the back surface of a semiconductor chip to a conductor pattern disposed on a principal surface (front surface) of an insulative substrate that is a ceramic substrate having conductor patterns on the surfaces thereof. Such a solder alloy needs high strength against thermal fatigue, because large thermal strain develops in the soldering area. The back surface of the semiconductor chip joins to the conductor pattern on the surface of the insulative substrate in a face-bonding way, and thermal expansion coefficients are different in a semiconductor chip and in a conductor pattern. In addition, the semiconductor chip generates heat in a conducting period. Therefore, the soldering portion suffers from large thermal strain.

In power semiconductor devices installed in a power converter for power conversion in electric vehicles, the conductor pattern disposed on the other principal surface (a back surface) of an insulative substrate is joined to a heat sink plate made of a metal. Since the soldering area is very wide, the solder alloy used for this joint must exhibit excellent wettability. Further, in the joining area between the heat sink plate and the conductor pattern on the back surface of the insulative substrate, large thermal strain develops caused by the difference in thermal expansion coefficients of the insulative substrate (a ceramic substrate) and the heat sink plate. Since the soldering area in the joint between the heat sink plate and the conductor pattern on the back surface of the insulative substrate is large, the generated strain in the soldering area is larger than the strain that develops in the joint between the semiconductor chip and the conductor pattern on the front surface of the insulative substrate as mentioned earlier.

Recently, a solder alloy that does not contain lead (Pb) is in demand in view of environmental considerations. One of such known solder alloys is a tin (Sn)—antimony (Sb) alloy. A known solder alloy (see Japanese Unexamined Patent Application Publication No. H11-58066, for example) contains tin (Sn) as a principal component, and antimony (Sb) not more than 3.0 wt %, silver (Ag) not more than 3.5 wt %, germanium (Ge) not more than 0.1 wt %, and further, copper not more than 1.0 wt % or nickel not more than 1.0 wt % or the both elements. Another known solder alloy (see Japanese Unexamined Patent Application Publication No. 2003-94194, for example) contains germanium (Ge) in the range of 0.01 to 10 wt %, antimony in the range of 5 to 30 wt %, and tin (Sn) in the range of 65 to 90 wt %.

A tin (Sn)—antimony (Sb) alloy, having a peritectic point at 8.5 wt % of antimony (Sb) and a temperature of 245° C., is generally used with a composition containing antimony (Sb) within 8 wt %. Melting of the tin (Sn)—antimony (Sb) alloy occurs at temperatures between 232° C., the melting point of tin (Sn), and 245° C., the peritectic point. The liquid-solid coexistence region is narrow, the heat resistance is favorable, and mechanically superior performances can be obtained by increasing the antimony (Sb) content. A large content of antimony (Sb), however, results in a problem of low wettability upon soldering the alloy. Oxidation of a solder component such as tin (Sn) involves another problem of deteriorated bonding performance.

SUMMARY OF THE INVENTION

The present invention has been made in view of the above problems, and an object of the invention is to provide a method for producing a semiconductor device employing the solder alloy of a tin (Sn)—antimony (Sb) system exhibiting excellent wettability and satisfactory bonding performance.

The solder alloy according to one embodiment of the invention contains antimony in a range of 3 wt % to 5 wt %, a trace amount of germanium, and a balance of tin.

A solder alloy according to another aspect of the invention is the solder alloy according to the first embodiment of the invention, wherein the content of the germanium is not more than 0.2 wt %.

According to another embodiment of the invention, a semiconductor device using a solder alloy comprises an insulative substrate having conductor patterns on both surfaces thereof, a semiconductor chip joined to a conductor pattern on a front surface of the insulative substrate, and a heat sink plate joined to a conductor pattern on a back surface of the insulative substrate. The conductor pattern on the back surface of the insulative substrate and the heat sink plate are soldered with a solder alloy that contains antimony in a range of 3 wt % to 5 wt %, a trace amount of germanium, and the balance of tin.

According to another embodiment of the invention, a back surface of the semiconductor chip and the conductor pattern on the front surface of the insulative substrate are soldered with a solder alloy that contains antimony in a range of 3 wt % to 5 wt %, a trace amount of germanium, and the balance of tin.

According to another embodiment of the invention, electrodes disposed on the surfaces of the semiconductor chip and conductors for wiring are soldered with a solder alloy that contains antimony in a range of 3 wt % to 5 wt %, a trace amount of germanium, and the balance of tin.

According to another aspect of the semiconductor device embodiment of the invention, the content of the germanium in the solder alloy is not more than 0.2 wt %.

According to another aspect of the semiconductor device embodiment of the invention, the insulative substrate is a ceramic substrate substantially composed of alumina, aluminum nitride, or silicon nitride and having copper patterns on both surfaces of the substrate, and the heat sink plate is made of copper.

By adding antimony (Sb) to tin (Sn) according to the various embodiments of the invention described above, heat resistance and strength against thermal fatigue of the alloy are improved. The melting temperature rises and heat resistance of the alloy increases. Coarsening of crystal grains of tin (Sn) due to thermal stress is suppressed, thereby improving the thermal fatigue characteristics. Here, because the thermal fatigue life is very short if the content of antimony (Sb) is less than 3 wt %, the amount of additive antimony (Sb) is preferably at least 3 wt %. If the content of antimony (Sb) is more than 5 wt %, wettability of the solder deteriorates. Accordingly, the amount of additive antimony (Sb) is preferably not more than 5 wt %.

By adding a trace amount of germanium (Ge) to the tin (Sn)—antimony (Sb) solder alloy, a thin oxide film is formed when the solder melts, thereby suppressing oxidation of a solder component such as tin (Sn) and improving bonding performance. Here, an amount of additive germanium (Ge) is preferably at least 0.01 wt % in order to achieve sufficient effect to suppress oxidation. With a germanium content of more than 0.2 wt % on the other hand, the oxide film with the germanium (Ge) grows too thick, which adversely affects the bonding performance. Accordingly, the amount of additive germanium is appropriately not more than 0.2 wt %. Therefore, the germanium added in an amount in the range of 0.01 to 0.2 wt % provides satisfactory bonding performance as well as excellent thermal fatigue characteristic.

According to the invention, a tin (Sn)—antimony (Sb) solder alloy is obtained that exhibits excellent wettability and satisfactory bonding performance. According to the invention, a semiconductor device is obtained using a solder alloy of tin (Sn)—antimony (Sb) system that exhibits excellent wettability and satisfactory bonding performance.

As for the temperature of a soldering process in the invention, the liquidus temperature of the solder alloy in the invention is 240 C.°, and the solidus temperature is 234 C.°. Generally, it is known that it is ideal to conduct the soldering process at a temperature over about 50 degree higher than a melting point of the solder alloy. In the present invention, in order to completely melt the solder, soldering process is conducted in a range of 310 C.°-320 C.°. When the soldering process is conducted in a hydrogen reducing furnace at such a high temperature, a reduction ability of hydrogen is enhanced and the solder alloy is completely fused. Therefore, the soldering process is conducted in a range of 310 C.°-320 C.°.

BRIEF DESCRIPTION OF THE DRAWINGS

The FIGURE is a sectional view of an example of a semiconductor device using a solder alloy according to an embodiment of the present invention.

DETAILED DESCRIPTION OF THE PREFERRED EMBODIMENTS

Figure 1:
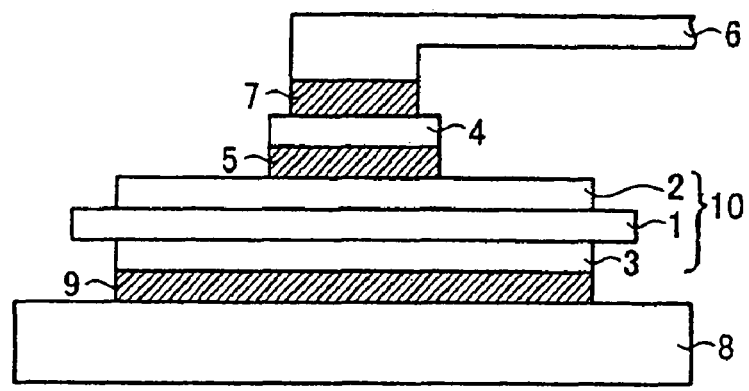

Some preferred embodiments of a semiconductor device using the solder alloy according to the invention will be described in detail in the following with reference to the accompanying drawing FIGURE.

A solder alloy is prepared by melting the raw materials of tin (Sn), antimony (Sb), and germanium (Ge) in an electric furnace. Purity of each raw material is 99.99% or more. Compositions of the materials are antimony 3 to 5 wt %, germanium 0.01 to 0.2 wt %, and the balance of tin (Sn), a main component.

In the invention, antimony is added to suppress thermal fatigue and degradation of the solder alloy. Also, germanium is added to improve wettability or soldering characteristic. In soldering, germanium is oxidized to remove oxidized layers of tin and antimony.

In the solder alloy of the invention, the liquidus temperature is 240 C.°, and the solidus temperature is 234 C.°. In using the solder alloy, the soldering process is conducted in the hydrogen reducing furnace in the range of 310 C.°-320 C.° higher than the regular soldering temperature, so that the solder alloy is completely fused and the reduction ability of hydrogen is enhanced.

Next, an example of method for producing a semiconductor device using the above-described solder alloy is described below. The method for producing a semiconductor device having the solder alloy comprises: preparing the solder alloy including antimony in a range of from 3 to 5 wt %, a trace amount of germanium, and a balance of tin; preparing a insulative substrate having conductor patterns on both surfaces thereof; mounting a heat sink plate on a back surface of the insulative substrate by a soldering process using the solder alloy at a temperature ranging from 310 C.° to 320 C. ° in a hydrogen reducing furnace; and mounting a semiconductor chip on a front surface of the insulative substrate.

The FIGURE is a sectional view illustrating a structure of the semiconductor device. Referring to the FIGURE, an insulative substrate 10 comprises a ceramic substrate 1 and conductor patterns 2 and 3 joined on both surfaces of the ceramic substrate. The ceramic substrate 1 is substantially composed of alumina, aluminum nitride, or silicon nitride. The conductor pattern 2 formed on the front surface of the ceramic substrate 1 is a metallic conductor pattern composing an electric circuit. On the back surface of the ceramic substrate 1 is provided a metallic conductor pattern 3. The conductor patterns 2 and 3 are preferably formed of copper, which is inexpensive and exhibits high thermal conductivity.

On the back surface of the semiconductor chip 4 are provided back surface electrodes of metallic films (not shown in the FIGURE). The back surface electrodes are joined to the conductor pattern 2 on the front surface of the insulative substrate 10 with a solder alloy 5 having a composition as described previously.

On the front surface of the semiconductor chip 4 are provided front surface electrodes of metallic films (not shown in the FIGURE). The front surface electrodes are joined to the wiring conductor 6 with a solder alloy 7 having a composition as described previously.

The conductor pattern 3 on the back surface of the insulative substrate 10 is joined to the metallic heat sink plate 8 with a solder alloy 9 having a composition as described previously. The heat sink plate 8 is a heat conductor to external cooling fins of the semiconductor package not shown in the FIGURE. The heat sink plate 8 is preferably made of copper, which is inexpensive and exhibits high thermal conductivity.

In the joining area between the conductor pattern 3 on the back surface of the insulative substrate 10 and the heat sink plate 8, large thermal strain develops due to the difference in thermal expansion coefficient between the ceramic substrate 1 of the insulative substrate 10 and the heat sink plate 8. Copper in particular, having a large thermal expansion coefficient, exhibits a thermal expansion coefficient considerably different from the ceramic substrate 1. So, large strain is generated in the joining area between the conductor pattern 3 on the back surface of the insulative substrate 10 and the heat sink plate 8. If a heat sink plate 8 is made of a material (for example aluminum or an alloy of copper and molybdenum) having a thermal expansion coefficient smaller than copper, the generation of strain due to the difference in thermal expansion coefficient would be reduced. These materials, however, are expensive and exhibit low thermal conductivity, which deteriorates the cooling characteristic of the semiconductor device.

By using a solder alloy with the above-described composition for joining the conductor pattern 3 and the heat sink plate 8, excellent cooling characteristics and satisfactory bonding performance can be achieved employing copper with low cost and high thermal conductivity. A solder material with a different composition from that of the solder alloy 5, 7, 9 may be used for joining the front surface electrodes of the semiconductor chip 4 and the wiring conductor 6, and for joining the back surface electrodes of the semiconductor chip 4 and the conductor pattern 2 on the insulative substrate 10.

Examples 1 Through 4

Solder alloys of a tin (Sn)—antimony (Sb) system were prepared in the compositions of antimony (Sb): 5.0 wt %, germanium (Ge): four steps of contents in the range of 0.01 to 0.2 wt %, and the balance of tin (Sn). Germanium content was 0.01 wt % in Example 1, 0.05 wt % in Example 2, 0.1 wt % in Example 3, and 0.2 wt % in Example 4.

Examples 5 Through 8

Solder alloys of tin (Sn)—antimony (Sb) system were prepared in the compositions of antimony (Sb): 3.0 wt %, germanium (Ge): four steps of contents in the range of 0.01 to 0.2 wt %, and the balance of tin (Sn). Germanium content was 0.01 wt % in Example 5, 0.05 wt % in Example 6, 0.1 wt % in Example 7, and 0.2 wt % in Example 8.

Comparative Examples 1 Through 4

Solder alloys not containing germanium (Ge) were prepared for comparison. The content of antimony (Sb) was 6.0 wt % in Comparative Example 1, 5.0 wt % in Comparative Example 2, 3.0 wt % in Comparative Example 3, 2.0 wt % in Comparative Example 4; the remainder was tin (Sn) in every Comparative Example.

On each of the thus obtained solder alloys, the wettability (wet strength) was measured using soldering flux (RMA type) by means of a meniscograph method. On each solder alloy, the rate of wetted area and the wetting angle were measured and the generation of an oxide film on the melt was observed. The thermal fatigue life was also evaluated on each solder alloy. In the evaluation of thermal fatigue life, a conjugated body (a combination of the heat sink plate 8 and the insulative substrate 10 having the conductor pattern 3 joined together with the solder alloy 9 as illustrated in the FIGURE) was manufactured by joining a metallic conductor pattern on an insulative substrate to a metallic heat sink plate using each solder alloy.

To each of these conjugated bodies, loading of temperature cycles was subjected, repeating the temperatures of −40 and 125° C. The length of the crack was measured after 1,000 cycles. Table 1 gives the results. In the column entitled "oxide film" in Table 1, the marks x and ○ represent the generation of oxide film being significant and very scarce, respectively.

Table 1 shows the following. With the increase of the added antimony (Sb), the thermal fatigue performance improves, but the increase beyond 5.0 wt % does not provide further improvement of the thermal fatigue performance. On the other hand, antimony (Sb) content less than 3.0 wt % significantly worsens the thermal fatigue performance. Addition of 0.01 to 0.2 wt % of germanium remarkably suppresses generation of an oxide film on the molten solder and at the same time improves wettability.

The addition of germanium (Ge) is effective for both flow soldering and reflow soldering. Further, the effect of germanium is valid in both cream solder and sheet solder. The addition of germanium (Ge) in the amount more than 0.01 wt % made no significant difference in the wettability and the oxide film formation as increased from the germanium content of 0.01 wt %. The added germanium (Ge), suppressing oxidation of tin (Sn), is effective not only in the process of soldering but also in the process of preparing a solder alloy, to provide a solder alloy with essentially no oxidation film, and of high quality.

In a process of manufacturing powder of solder alloy for cream solder, for example, each particle of the powder is desired to have a spherical shape. To obtain the powder of spherical particles, the powder is necessarily manufactured under a condition in which only the surface tension works, which requires suppressing the surface oxidation to the minimum possible degree. Therefore, germanium (Ge) is beneficially added to suppress the surface oxidation. The rate of oxidation of germanium (Ge) is stable and only a small amount of the additive holds the effect.

As described above, the addition of germanium (Ge) in a tin (Sn)—antimony (Sb) alloy provides a solder alloy exhibiting excellent thermal fatigue performance, a solder alloy exhibiting heat resistance, a solder alloy exhibiting high wettability, and a solder alloy exhibiting satisfactory bonding performance. Because the alloy is free of lead (Pb), a solder alloy that does not cause environmental pollution is provided.

As described above, a method for producing a semiconductor device using the solder alloy according to the invention is beneficially applied to productions of a variety of apparatuses having soldered parts, and is particularly suited to productions of semiconductor devices for power conversion used in a power conversion apparatus installed in electric vehicles.

TABLE 1

|  | Sb (wt %) | Ge (wt %) | Sn | wet strength (mN) | wetting angle (°) | rate of wetted area (%) | oxide film | crack length after 1,000 cycles (mm) |
| --- | --- | --- | --- | --- | --- | --- | --- | --- |
| Comp Ex 1 | 6.0 | — | balance | — | — | — | — | 3.0 |
| Comp Ex 2 | 5.0 | — | balance | 14.4 | 9.7 | 83.6 | x | 3.0 |
| Example 1 | 5.0 | 0.01 | balance | 15.2 | 3.3 | 100.0 | ○ | — |
| Example 2 | 5.0 | 0.05 | balance | 15.1 | 3.8 | 100.0 | ○ | — |
| Example 3 | 5.0 | 0.1 | balance | 15.1 | 4.2 | 100.0 | ○ | — |
| Example 4 | 5.0 | 0.2 | balance | 15.3 | 4.3 | 100.0 | ○ | — |
| Comp Ex 3 | 3.0 | — | balance | 14.5 | 9.5 | 84.0 | x | 3.4 |
| Example 5 | 3.0 | 0.01 | balance | 15.2 | 3.1 | 100.0 | ○ | — |
| Example 6 | 3.0 | 0.05 | balance | 15.2 | 3.4 | 100.0 | ○ | — |
| Example 7 | 3.0 | 0.1 | balance | 15.3 | 3.5 | 100.0 | ○ | — |
| Example 8 | 3.0 | 0.2 | balance | 15.3 | 3.8 | 100.0 | ○ | — |
| Comp Ex 4 | 2.0 | — | balance | — | — | — | — | 9.1 |

What is claimed is:

1. A method for producing a semiconductor device, comprising:
    preparing a solder alloy including antimony in a range of from 3 to 5 wt %, a trace amount of germanium from 0.01 to 0.2 wt %, and a balance of tin;
    preparing an insulative substrate having conductor patterns on two surfaces thereof; and
    mounting a heat sink plate on a back surface of the insulative substrate by a soldering process using the solder alloy at a temperature which is about 50 C.° above a melting point of the solder alloy and ranging from 310 C.° to 320 C.° in a furnace having a reducing atmosphere of hydrogen whereby an oxidation of the germanium removes oxidation layers from the antimony and tin to improve bonding performance.

2. A method for producing a semiconductor device according to claim 1, further comprising mounting a semiconductor chip on a front surface of the insulative substrate.

3. A method for producing a semiconductor device according to claim 2, wherein a back surface of the semiconductor chip and the conductor pattern on the front surface of the insulative substrate are soldered by the soldering process.

4. A method for producing a semiconductor device according to claim 1, wherein electrodes disposed on a front surface of a semiconductor chip, and conductors for wiring are soldered by the soldering process.

5. A method for producing a semiconductor device according to claim 1, wherein the insulative substrate is a ceramic substrate substantially composed of alumina, aluminum nitride, or silicon nitride, and has copper patterns on both surfaces of the substrate, and the heat sink plate is made of copper.

6. A method for producing a semiconductor device according to claim 1, wherein the solder is completely melted in the soldering process to enhance a reduction ability of hydrogen.

7. A method for producing a semiconductor device according to claim 1, wherein the solder alloy consists essentially of 3 to 5 wt % of antimony, 0.01 to 0.2 wt % of germanium, and a balance of tin.

8. A method for producing a semiconductor device according to claim 1, further comprising forming an oxide layer of the germanium when the solder melts, to avoid an adverse effect on bonding performance of the solder alloy.

9. A method for producing a semiconductor device according to claim 8, wherein a thickness of the oxide layer of the germanium is limited using up to 0.2 wt % germanium to provide the bonding performance and thermal fatigue characteristic.

* * * * *